United States Patent [19]

Kim et al.

[11] Patent Number: 5,721,153
[45] Date of Patent: Feb. 24, 1998

[54] METHOD OF MAKING CAPACITOR OF HIGHLY INTEGRATED SEMICONDUCTOR DEVICE USING MULTIPLE INSULATION LAYERS

[75] Inventors: Kyung-hoon Kim, Seoul; Young-wook Park; Cha-young Yoo, both of Kyungki-do, all of Rep. of Korea

[73] Assignee: Samsung Electronics Co., Ltd., Suwon, Rep. of Korea

[21] Appl. No.: 604,300

[22] Filed: Feb. 21, 1996

[30] Foreign Application Priority Data

Mar. 22, 1995 [KR] Rep. of Korea .................. 95-6109

[51] Int. Cl.[6] .................................... H01L 21/8242
[52] U.S. Cl. ..................... 437/60; 437/977; 437/978
[58] Field of Search ......................... 437/60, 200, 919, 437/977, 978; 148/DIG. 138

[56] References Cited

U.S. PATENT DOCUMENTS

| | | | |
|---|---|---|---|
| 5,102,832 | 4/1992 | Tuttle | 437/977 |
| 5,302,540 | 4/1994 | Ko et al. | 437/977 |
| 5,387,531 | 2/1995 | Rha et al. | 437/60 |
| 5,597,760 | 1/1997 | Hirota | 437/60 |

*Primary Examiner*—Chandra Chaudhari
*Attorney, Agent, or Firm*—Cushman Darby & Cushman IP Group of Pillsbury Madison & Sutro LLP

[57] ABSTRACT

A capacitor of a highly integrated semiconductor device and a manufacturing method thereof is provided. In the highly integrated semiconductor device, an HSG polysilicon layer pattern is formed having a multitude of hemispherical grains (HSG) on the top and side surfaces of the storage electrode. Thus, the etching of and damage to the HSG polysilicon layer pattern can be prevented, and capacitance can be increased by maximizing the surface area of the storage electrode.

9 Claims, 4 Drawing Sheets

METHOD OF MAKING CAPACITOR OF HIGHLY INTEGRATED SEMICONDUCTOR DEVICE USING MULTIPLE INSULATION LAYERS

BACKGROUND OF THE INVENTION

The present invention relates to a capacitor of a highly integrated semiconductor device and a manufacturing method thereof. More particularly, the present invention relates to a DRAM cell capacitor provided with a stable storage electrode which increases capacitance by forming a multitude of hemispherical grains on a surface of the storage electrode, and to a manufacturing method thereof.

To keep pace with recent improvements in integration density, various methods for multiplying the storage electrode surface area of a DRAM cell capacitor have received much attention. One such method is the formation of a hemispherical-grain (HSG) polysilicon layer on the outer surface of the storage electrode, to thereby increase the surface area.

FIGS. 1A-1E are section views useful for explaining a conventional method of manufacturing the capacitor.

FIG. 1A shows the step of forming spacer 20. In detail, first to third insulation layers such as an oxide layer, a silicon nitride layer and another oxide layer are successively deposited on a semiconductor substrate 10. Then, contact hole 18, for exposing a predetermined region of the semiconductor substrate, is formed by patterning the first to third insulation layers via photolithography and concurrently, forming first to third insulation layer patterns 12, 14 and 16. Next, spacer 20 formed of the nitride silicon layer is formed on the sidewalls of contact hole 18.

FIG. 1B shows the step of forming photoresist layer pattern 24. A polysilicon layer 22 is deposited on the whole surface of the resultant structure of FIG. 1A, completely filling contact hole 18. Then, photoresist pattern 24 is formed on polysilicon layer 22 above contact hole 18 by using a storage electrode mask.

FIG. 1C shows the step of patterning polysilicon layer pattern 22a. That is, polysilicon layer pattern 22a covering contact hole 18 is formed by etching polysilicon layer 22 using photoresist pattern 24 as a mask.

FIG. 1D shows the step of depositing HSG polysilicon layer 26. After photoresist pattern 24 is removed, HSG polysilicon layer 26 is deposited on the whole surface of the resulting structure.

FIG. 1E shows the step of completing the capacitor. In detail, HSG polysilicon layer 26 is anisotropically etched to electrically isolate polysilicon layer pattern 22a from the adjacent polysilicon layer pattern. As a result, HSG polysilicon layer 26 formed on third insulation layer pattern 16 between the adjacent polysilicon layer patterns and on the upper surface of polysilicon layer pattern 22a, is etched away and thus removed. Here, as shown in the drawing, the upper surface of polysilicon layer pattern 22a is etched under the influence of an uneven surface of HSG polysilicon layer 26, forming a deformed polysilicon layer pattern 22b having very irregular surface protrusions. Here, portions (A) on the upper portions of the sidewalls of deformed polysilicon layer pattern 22b are also etched together with HSG polysilicon layer 26, thus exposing deformed polysilicon layer pattern 22b. Consequently, HSG polysilicon layer pattern 26a is formed only on the lower portions of the sidewalls of deformed polysilicon layer pattern 22b.

Then, the capacitor is completed by successively depositing a dielectric layer (not shown) and a conductive layer for a plate electrode (not shown), using a common method, on the whole surface of the semiconductor device where the storage electrode comprising deformed polysilicon layer pattern 22b and HSG polysilicon layer pattern 26a, is formed.

As described above, the HSG polysilicon layer is anisotropically etched to electrically isolate the adjoining storage electrodes from each other. Here, not only the HSG polysilicon layers on the upper surface of the polysilicon layer pattern and the third insulation layer pattern, but also the HSG polysilicon layer formed on the upper portions of the sidewalls of the polysilicon layer pattern are etched too. Thus, since the deformed polysilicon layer pattern has very irregular surface protrusions and a damaged surface, excessive leakage current occurs. Also, the surface area of the storage electrode becomes smaller than desired since the upper portions of the sidewalls of the deformed polysilicon layer pattern are exposed.

SUMMARY OF THE INVENTION

To solve the above problems, it is an object of the present invention to provide a capacitor of a highly integrated semiconductor device which is capable of multiplying the surface area of a storage electrode and reducing leakage current.

It is another object of the present invention to provide a method of manufacturing the capacitor.

Accordingly, to achieve the above first object, there is provided a capacitor of a highly integrated semiconductor device, wherein a storage electrode is formed of a multitude of hemispherical grains on the whole surface.

To achieve the above second object, there is provided a method for manufacturing a capacitor of a highly integrated semiconductor device, comprising the steps of: successively forming on a semiconductor substrate first to third insulation layer patterns, a metal layer pattern and a fourth insulation layer pattern and forming a contact hole for exposing a predetermined region of the semiconductor substrate therein; forming a spacer on the sidewalls of the contact hole; forming a conductive layer on the whole surface of the resultant structure completely filling the contact hole; forming a photoresist pattern on the conductive layer over the contact hole; forming a conductive layer pattern and a deformed fourth insulation layer for exposing the metal layer pattern around the contact hole and by sequentially etching the conductive layer and the fourth insulation layer using the photoresist pattern as an etching mask; removing the photoresist pattern; depositing an HSG (hemispherical grain) polysilicon layer on the whole surface of the resultant structure from removing the photoresist pattern; forming a metal silicide layer between the deformed fourth insulation layer pattern by reacting the exposed metal layer with the HSG polysilicon layer thereon; and removing the metal silicide layer with a chemical solution. Thus, a storage electrode consisting of the conductive layer pattern and the HSG polysilicon layer formed on the top and side surfaces of the conductive pattern is formed.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1A:
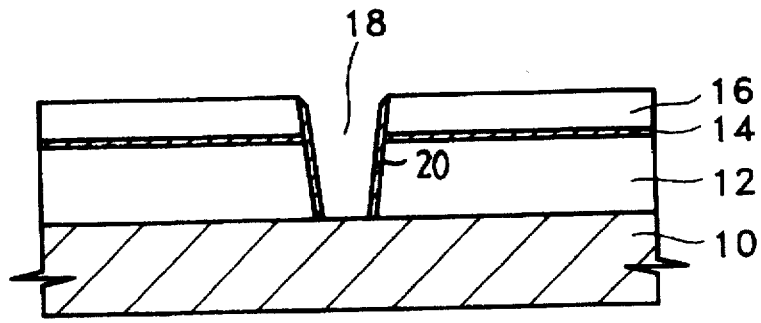
FIGS. 1A-1E are section views for explaining a manufacturing method of a capacitor according to conventional technology.
Figure 1B:
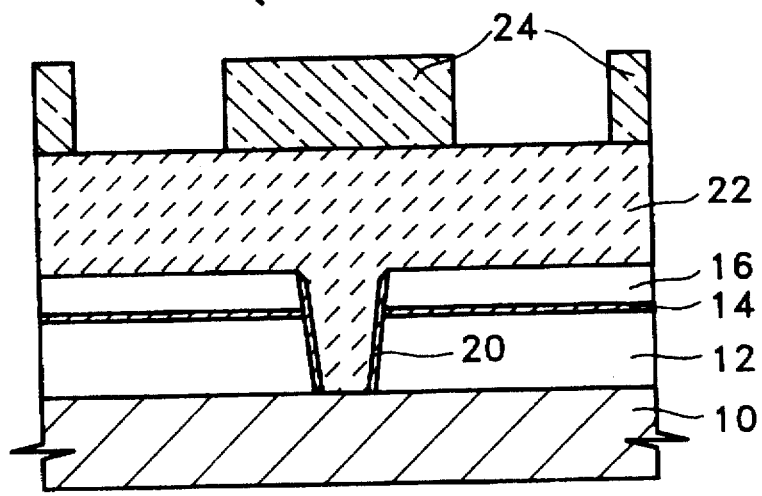
Figure 1C:
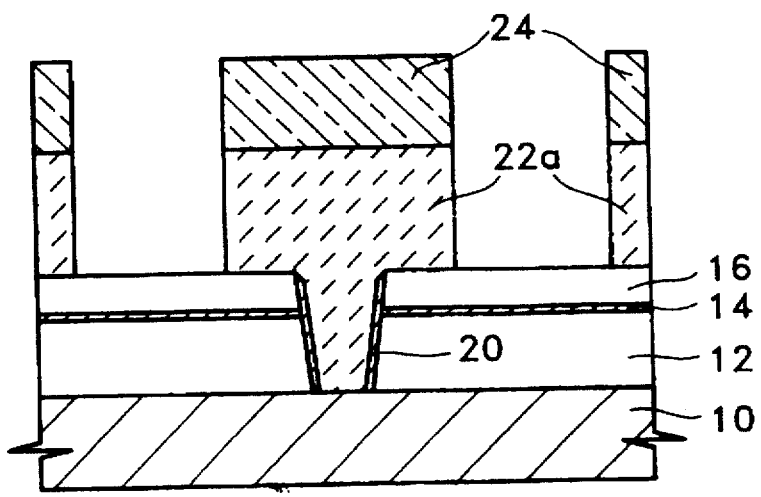
Figure 1D:
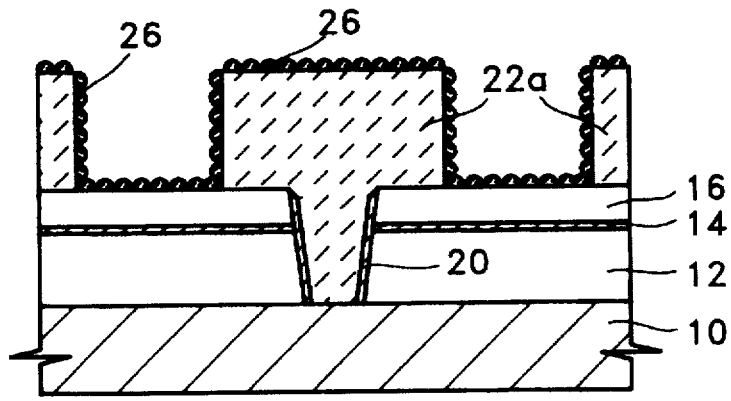
Figure 1E:
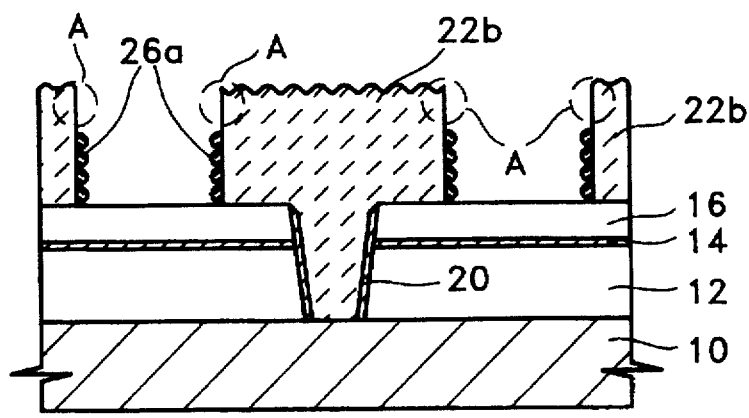
Figure 2:
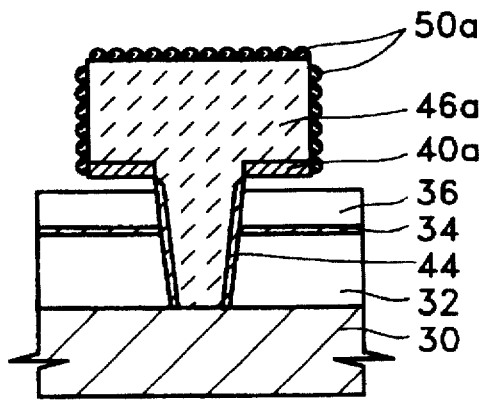
FIG. 2 is a section view illustrating the structure of the capacitor according to the present invention.

In FIG. 2, illustrating the structure of the capacitor of the present invention, a reference numeral 30 denotes a semiconductor substrate; reference numeral 32 denotes a first insulation layer pattern being formed on semiconductor substrate 30 and including a contact hole for exposing a predetermined portion thereof; reference numeral 34 denotes a second insulation layer pattern being formed on first insulation layer pattern 32; reference numeral 36 denotes a third insulation layer pattern formed on second insulation layer pattern 34; reference numeral 40a denotes a deformed fourth insulation layer pattern formed with a space above third insulation layer pattern 36 around the contact hole; reference numeral 44 denotes a spacer formed on the sidewalls of the contact hole formed through first, second and third insulation layer patterns 32, 34 and 36 and connected with deformed fourth insulation layer pattern 40a; reference numeral 46a denotes a conductive layer pattern being formed on deformed fourth insulation layer pattern 40a and filling the contact hole enclosed by spacer 44; and reference numeral 50a denotes an HSG polysilicon layer pattern formed on surfaces of conductive layer pattern 46a. Here, conductive layer pattern 46a and HSG polysilicon layer pattern 50a formed thereon constitute a storage electrode of the capacitor.

As shown in FIG. 2, in the present invention, since a non-etched or undamaged HSG polysilicon layer pattern can be formed on the whole surface of the storage electrode, the surface area of the storage electrode can be maximized.

FIGS. 3A-3F are section views of the process steps and are useful for explaining the method of manufacturing the capacitor of the present invention shown in FIG. 2.

Figure 3A:
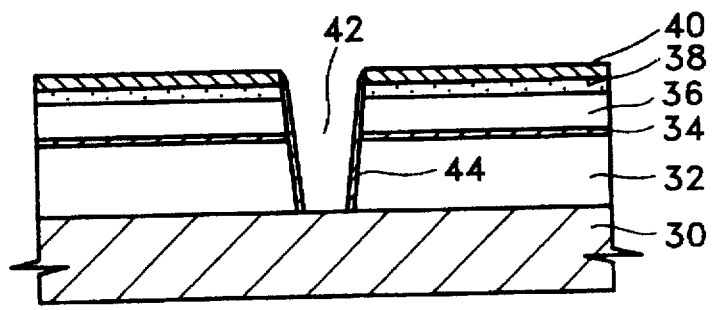
FIGS. 3A-3F are section views for explaining the manufacturing method of the capacitor according to the present invention.

FIG. 3A shows the step of forming spacer 44. First, second and third insulation layers, e.g., an oxide layer, a silicon nitride layer and another oxide layer, are successively deposited atop semiconductor substrate 30. Then, a metal layer which is any one selected from the group consisting of a tungsten layer, a tungsten nitride layer and a tungsten-rich tungsten nitride layer is deposited on the third insulation layer. Subsequently, a fourth insulation layer, e.g., either a silicon nitride layer or an oxide layer, is deposited on the metal layer as a silicidation preventing layer. A contact hole 42 for exposing a predetermined region of semiconductor substrate 30 is formed by patterning the first to third insulation layers, the metal layer and the fourth insulation layer, and concurrently, first to third insulation layer patterns 32, 34 and 36, a metal layer pattern 38 and fourth insulation layer pattern 40 are formed.

Next, after the silicon nitride layer is formed on the whole surface of the semiconductor substrate where contact hole 42 is formed, spacer 44 formed of the silicon nitride layer is formed on the sidewalls of contact hole 42 by anisotropically etching the silicon nitride layer formed on the whole surface of the semiconductor substrate. Here, fourth insulation pattern 40 and spacer 44 serve as a silicidation preventing layer when metal layer pattern 38 is reacted to be a silicide layer in a subsequent process.

Figure 3B:
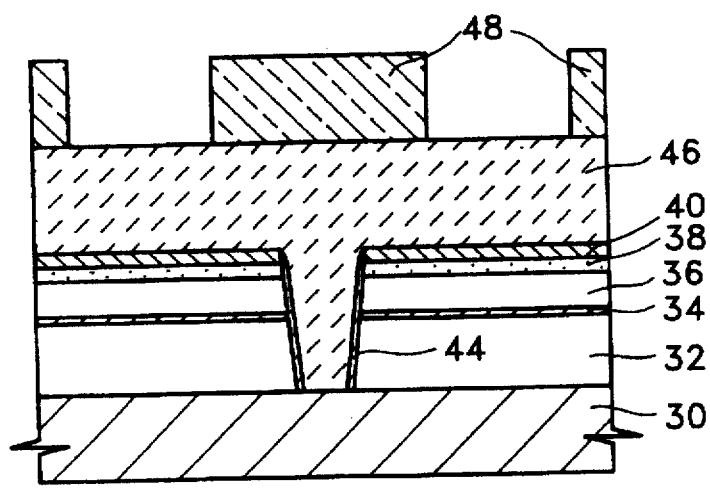

FIG. 3B shows the step of forming photoresist layer pattern 48. A conductive layer 46 such as a polysilicon layer is formed on fourth insulation layer pattern 40, completely filling contact hole 42. A photoresist pattern 48 is formed on conductive layer 46 over contact hole 42 by using a mask for a storage electrode.

Figure 3C:
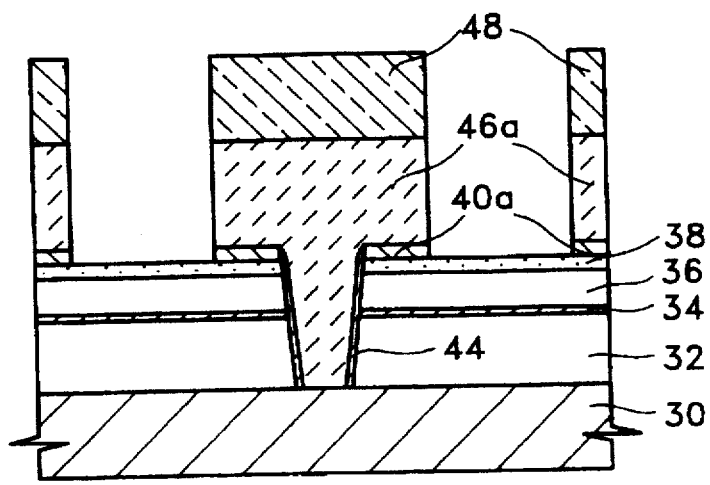

FIG. 3C shows the step of forming conductive pattern 46a and deformed fourth insulation layer pattern 40a. By using photoresist pattern 48 as an etching mask, conductive layer 46 and fourth insulation layer pattern 40 are anisotropically etched away to thereby form conductive layer pattern 46a and deformed fourth insulation layer pattern 40a. Here, metal layer 38 around contact hole 42 is exposed.

Figure 3D:
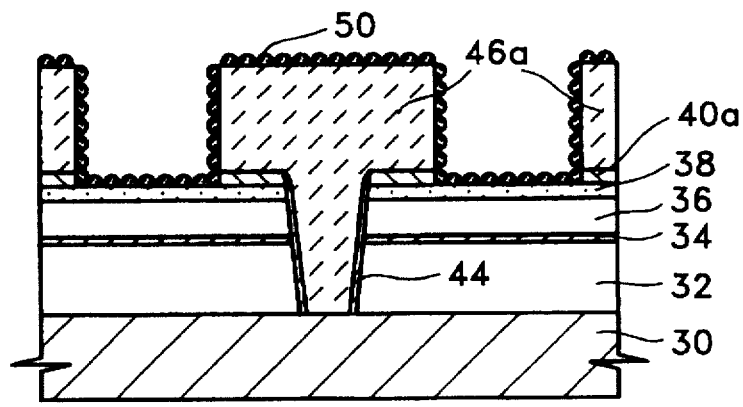

FIG. 3D shows the step of forming HSG polysilicon layer 50. Primarily, photoresist pattern 48 is removed. Then, by employing a common method, HSG polysilicon layer 50 is deposited on the whole surface of the semiconductor substrate from which photoresist pattern 48 has been removed.

Figure 3E:
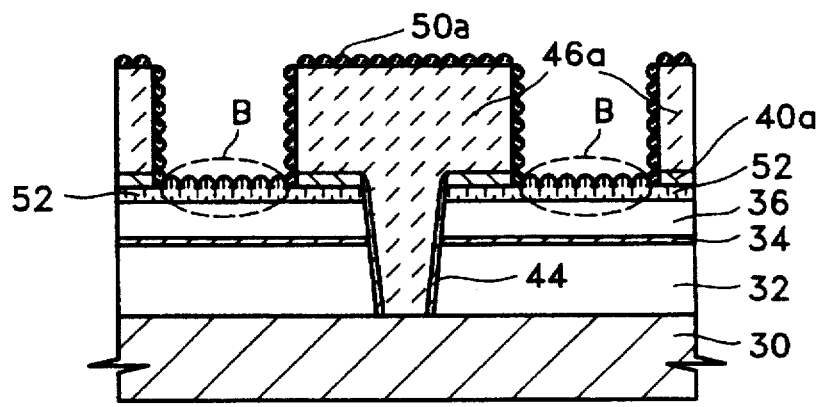

FIG. 3E shows the step of forming metal silicide layer 52, by which the present invention is characterized. In detail, in the present invention, a semiconductor substrate where HSG polysilicon layer 50 is deposited is heat-treated at a temperature of 550°~700° C. Metal silicide layer 52 such as a tungsten silicide layer is formed by chemically reacting HSG polysilicon layer 50 formed in regions between deformed fourth insulation layer patterns 40a, indicated by "B," with metal layer pattern 38 thereunder. In doing so, HSG polysilicon layer pattern 50a on the top and side surfaces of conductive layer pattern 46a remains intact. Here, the above heat-treatment is performed by a rapid thermal processing method or a method utilizing a furnace.

Figure 3F:
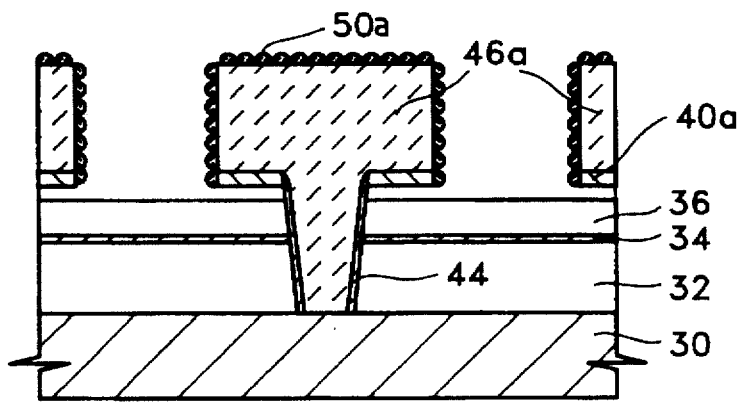

FIG. 3F shows the completion step of the storage electrode. Metal silicide layer 52 is removed by using a chemical solution of $NH_4OH$, $H_2O_2$ and deionized water. Thus, the storage electrode made of conductive layer pattern 46a and HSG polysilicon layer pattern 50a is completed by removing metal silicide layer 52. Here, the storage electrode is electrically isolated with the adjacent storage electrode, and HSG polysilicon layer pattern 50a which is physically undamaged is formed on the whole surface of the storage electrode.

Finally, the capacitor of the present invention is completed by successively depositing a dielectric layer (not shown) and a conductive layer (not shown) on the whole surface of the resultant structure.

As described above, according to the preferred embodiment of the present invention, the metal silicide layer is formed by chemically reacting the HSG polysilicon layer formed between the deformed fourth insulation layer patterns and the metal layer pattern thereunder. Then, the metal silicide layer is removed by employing a wet-etching process to isolate the storage electrode from the adjacent storage electrode. Accordingly, the HSG polysilicon layer pattern formed on the top and side surfaces of the conductive pattern can be prevented from being etched and damaged. Thus, capacitance of the capacitor can be increased by maximizing the surface area of the storage electrode consisting of the conductive layer pattern and the HSG polysilicon layer pattern. Also, the leakage current can be greatly reduced.

It should be noted that the present invention is not limited to the preferred embodiment described above, and it is apparent that variations and modifications by those skilled in the art can be effected within the spirit and scope of the present invention as defined in the appended claims.

What is claimed is:

1. A method for manufacturing a capacitor of a highly integrated semiconductor device, comprising the steps of:

(a) successively forming on a semiconductor substrate first, second and third insulation layer patterns, a metal layer pattern and a fourth insulation layer pattern and forming a contact hole for exposing a region of said semiconductor substrate therein;

(b) forming a spacer on the sidewalls of said contact hole;

(c) forming a conductive layer for completely filling said contact hole on the whole surface of the resultant structure from said step (b);

(d) forming a photoresist pattern on the conductive layer over the contact hole;

(e) forming a conductive layer pattern for exposing said metal layer pattern around said contact hole and deformed fourth insulation layer patterns by sequentially etching said conductive layer and said fourth insulation layer using said photoresist pattern as an etching mask;

(f) removing said photoresist pattern;

(g) depositing an HSG (hemispherical grain) polysilicon layer on the whole surface of the resultant structure from said step (f);

(h) forming a metal silicide layer between said deformed fourth insulation layer patterns by reacting said exposed metal layer with said HSG polysilicon layer thereon; and (i) removing said metal silicide layer with a chemical solution, thereby forming a storage electrode consisting of said conductive layer pattern and said HSG polysilicon layer formed on the top and side surface of said conductive layer pattern.

2. A method for manufacturing a capacitor of a highly integrated semiconductor device according to claim 1, wherein said conductive layer is formed of polysilicon layer.

3. A method for manufacturing a capacitor of a highly integrated semiconductor device according to claim 1, wherein said metal layer is formed of any one selected from the group consisting of a tungsten layer, a tungsten nitride layer, and a tungsten-rich tungsten nitride layer.

4. A method for manufacturing a capacitor of a highly integrated semiconductor device according to claim 1, wherein said fourth insulation layer is formed of a silicon nitride layer.

5. A method for manufacturing a capacitor of a highly integrated semiconductor device according to claim 1, wherein said fourth insulation layer pattern is formed of an oxide layer.

6. A method for manufacturing a capacitor of a highly integrated semiconductor device according to claim 1, wherein said chemical solution is a mixture of $NH_4OH$, $H_2O_2$ and deionized water.

7. A method for manufacturing a capacitor of a highly integrated semiconductor device according to claim 1, wherein said chemical reaction is performed through heat-treatment at a temperature of 550°~700° C.

8. A method for manufacturing a capacitor of a highly integrated semiconductor device according to claim 7, wherein said heat-treatment is performed by a rapid thermal process.

9. A method for manufacturing a capacitor of a highly integrated semiconductor device according to claim 7, wherein said heat-treatment is performed by a furnace.

* * * * *